(12) United States Patent
Takahashi et al.

(10) Patent No.: US 6,242,750 B1
(45) Date of Patent: Jun. 5, 2001

(54) ION IMPLANTATION DEVICE

(75) Inventors: Yuji Takahashi, Shusou-gun; Koji Inada, Toyo, both of (JP)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/199,590

(22) Filed: Nov. 25, 1998

(51) Int. Cl.$^7$ .................................................. H01J 37/317
(52) U.S. Cl. ................. 250/492.21; 250/398; 250/396 R
(58) Field of Search .............................. 250/492.21, 398, 250/396 R

(56) References Cited

U.S. PATENT DOCUMENTS

| | | | |
|---|---|---|---|
| 5,747,936 | * 5/1998 | Harrison et al. | 315/111.81 |
| 5,780,863 | * 7/1998 | Benviste et al. | 250/492.21 |
| 5,883,391 | * 3/1999 | Adibi et al. | 250/492.21 |
| 5,932,882 | * 8/1999 | England et al. | 250/492.21 |

* cited by examiner

Primary Examiner—Jack Berman
Assistant Examiner—Nikita Wells
(74) Attorney, Agent, or Firm—John A. Kastelic

(57) ABSTRACT

The present invention provides ion implantation equipment in which the beam current in a lower energy region can be increased without making the equipment very large and the production of the equipment very expensive. A vacuum chamber 1 contains an ion source 2 and an extractor electrode system 3, and in the vacuum chamber, a liner 4, which covers said ion source and extractor electrode system, is provided across an insulator 5. Further, in the vacuum chamber, a beam guide 7, which guides the ion beam out of said extractor electrode system, is provided across an insulator 8. Around said ion beam guide, a mass analyzer magnet 6 is arranged, while a disk chamber 13 is provided across an insulator 9 at one end of the ion beam guide. A deceleration means of electrode apertures 10, 11 and 12, which converge and decelerate the ion beam, is arranged within said disk chamber.

7 Claims, 2 Drawing Sheets

ION IMPLANTATION DEVICE

PRIORITY

This patent application claims priority under the Paris Convention of Japanese Patent Application, Heisei 9, Patent Application No. 328781, naming as inventors Yuhji Takahashi and Kohji Inada, filed Nov. 28, 1997 with the Japanese Patent Office in the name of Sumitomo Eaton Nova, on behalf of the inventors.

TECHNICAL FIELD OF THE INVENTION

The present invention pertains to ion implantation equipment. It relates to ion implantation equipment in which a high beam current can be obtained even in a lower energy region.

BACKGROUND

In recent years, the semiconductor industry came to realize the necessity for ion implantation equipment in which a high beam current can be obtained even in the lower energy region, so that a shallow junction can be fabricated using boron ions and so forth.

An example is disclosed in Patent Application Publication No. Hei 4-6740. In this ion implantation equipment, a large current of an ion beam is implanted into a substrate through a beam transport system which contains mass analyzer tubes. A deceleration static electrode lens system is provided and consists of three electrodes, having a hole, to provide a large potential gradient and two electrodes, having a hole, for acceleration and deceleration. An ion source is kept at a positive potential at a few kV or higher, but below 20 kV, against the ground potential. The beam transport system between the ion source and the deceleration static electrode lens system is kept at a negative potential at a few or several tens of kV against the ground potential. The first electrode having a hole in the deceleration static lens system is kept at the same negative potential at a few or several tens of kV as the beam transport system. The third electrode having a hole in the deceleration static lens system is kept at the ground potential. The second electrode having a hole in the deceleration static lens system is kept at a middle potential between these of the first and third electrode having a hole. The fourth electrode having a hole in the deceleration static lens system is kept at a negative potential. The fifth electrode having a hole in the deceleration static lens system is kept at the ground potential. The deceleration static lens system is used as a convergent lens as well as for its deceleration function.

In such ion implantation equipment, a high voltage case needs to surround the ion source, an ion extractor system, the mass analyzer tubes, the beam transport system and so forth, so that all components within the high voltage case are insulated from the ground potential. In the above ion implantation equipment, this is achieved by floating the entire high voltage case from the remaining equipment. Hence, the equipment becomes large and manufacturing costs of such equipment becomes expensive. These are the issues.

The purpose of the present invention is to provide ion implantation equipment in which the beam current in a lower energy region can be increased without making such equipment very large and expensive to manufacture.

SUMMARY

The ion implantation equipment of the present invention has the characteristics in that its vacuum chamber contains an ion source and an extractor electrode system. In said vacuum chamber a liner which covers said ion source and extractor electrode system is provided across an insulator. Further in said vacuum chamber a beam guide, which guides the ion beam out of said extractor electrode system, is provided across an insulator. Around said ion beam guide, a mass analyzer magnet is arranged, while a disk chamber is provided across an insulator at one end of the ion beam guide, and an deceleration means, which converges and decelerates the ion beam, is arranged within said disk chamber.

Furthermore, said deceleration means has the characteristics in that it has an extension tube which extends out of the end of said beam guide and three electrode apertures are arranged at the exit end of said extension tube, wherein these three electrode apertures converge and decelerate an ion beam.

Further, it is preferred that the middle electrode aperture of said three electrode apertures is designed so that the aperture width can be switched according to what ions pass through it.

Moreover, it is preferred that a positive voltage is applied to said ion source, a negative voltage is applied to said extractor electrode system, a lower negative voltage than that for said extractor electrode system is applied to said liner and a lower negative voltage than that for said liner is applied to said beam guide.

In the present invention, the beam current in a lower energy region is increased by employing a simple external insulation method to accelerate and decelerate an ion beam within the design of the conventional mean line.

DETAILED DESCRIPTION OF A PREFERRED EMBODIMENT

Figure 1:
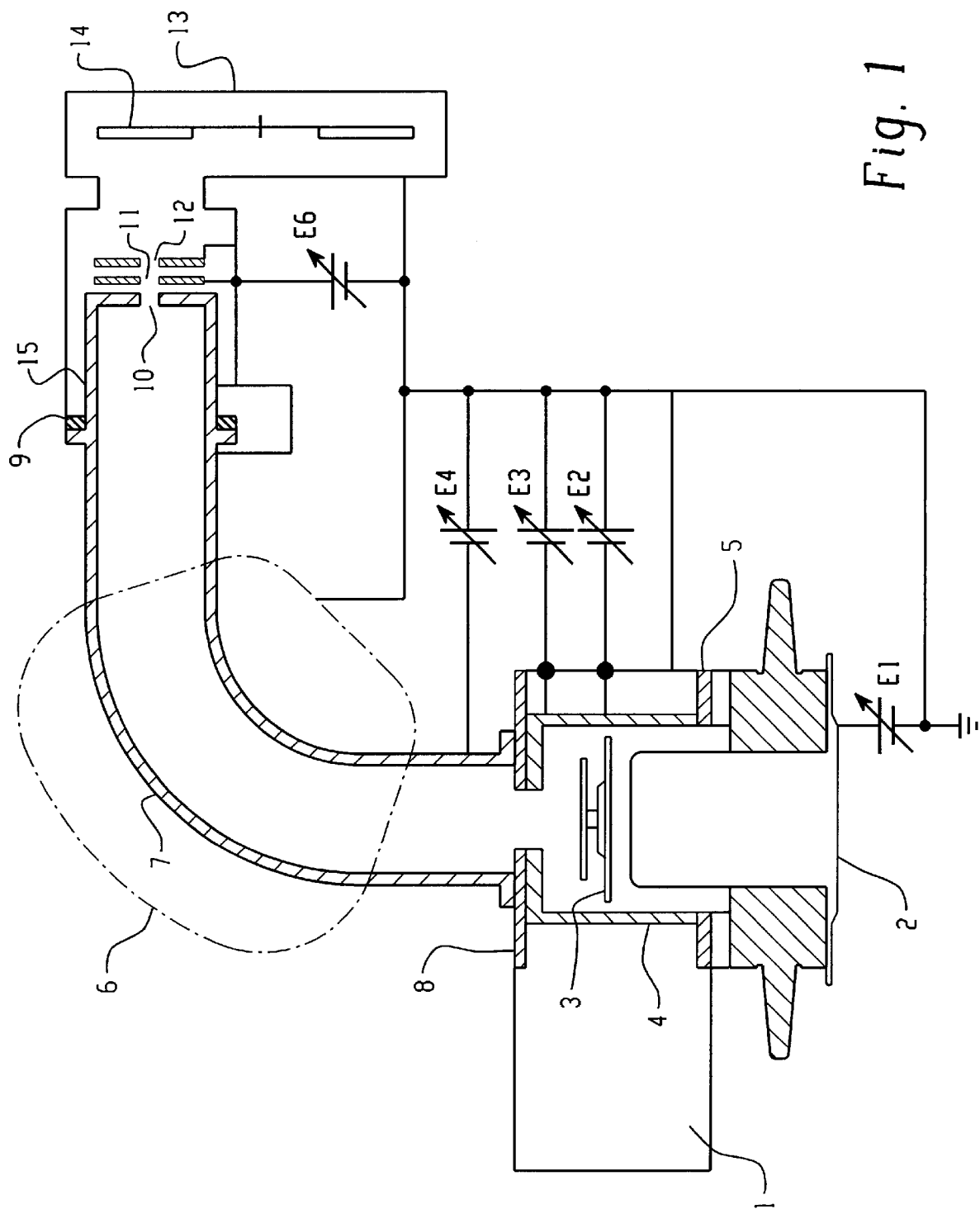
FIG. 1 is a diagram to show the design of the core section of the preferred example of ion implantation equipment under the present invention.

A preferred example of the present invention is explained while referencing FIG. 1. FIG. 1 is a diagram to show the design of the core section of the example of ion implantation equipment under the present invention. An ion source 2 is placed in a vacuum chamber 1, in which an ion beam is extracted. Vacuum chamber 1 is connected to the ground. An extractor electrode system 3 is provided over ion source 2 in vacuum chamber 1. A liner 4 covers ion source 2 and extractor electrode system 3 and is equipped with a function to independently apply a voltage to the extractor electrode system. An insulator 5 provides insulation between vacuum chamber 1 and liner 4. Numeral 6 is a mass analyzer magnet to isolate necessary ions with necessary energy out of the ion beam which is extracted through extractor electrode system 3.

Mass analyzer magnet 6 is provided around a beam guide 7, through which an ion beam travels. Beam guide 7 is equipped with a function to independently apply a voltage to the beam guide. An insulator 8 provides insulation between vacuum chamber 1 and beam guide 7. Moreover, an insulator 9 to facilitate insulation between beam guide 7 and a disk chamber 13 is provided.

An extension tube 15 is provided at one end of beam guide 7 and extends in the same direction as that of the beam guide therefrom. Electrode apertures 10, 11 and 12 are placed at an outlet of extension tube 15, which lies in proximity of wafer 14.

Normally, the ion beam which is generated by ion source 2 is extracted by ion beam extractor electrode system 3, to which a voltage of a few kV but below 20 kV is applied. After mass analyzer magnet 6 isolates the necessary ions with the necessary energy (more accurately speaking, necessary momentum), the ion beam passes through electrode apertures 10, 11 and 12, where the ion beam is decelerated, and thereafter is implanted into wafer 14.

In the present form with the above design, appropriate negative voltages are applied to liner 4, beam guide 7, extension tube 15, and electrode aperture 11, so that the ion beam is transported to the proximity of wafer 14 while it maintains high energy. Then, electrode apertures 10, 11 and 12 provide the deceleration and convergence effects, so that a large current of a low energy beam can be implanted into wafer 14.

Moreover, unlike conventional equipment designs, this equipment realizes the acceleration and deceleration functions of ion beam by a simple method which does not use a high voltage case within the equipment. Beam guide 7, electrode aperture 10, and extension tube 15 are connected so that they all have the same potential without fail herein. Liner 4 may have the same potential as that of beam guide 7, electrode aperture 10, and extension tube 15 or a voltage difference may be separately applied thereto.

As described above, the ion implantation equipment of the present form comprises ion source 2, extractor electrode system 3, mass analyzer magnet 6, beam guide 7, electrode apertures 10, 11 and 12, disk chamber 13 and so forth. Moreover, in this ion implantation equipment, there exists a provision which is connected to each of liner 4 which surrounds the perimeter of extractor electrode system 3, mass analyzer magnet 6, beam guide 7, electrode apertures 10, 11 and 12, and disk chamber 13, wherein functions exist to independently supply a voltage to each of these.

In such ion implantation equipment, as an example when a power source E1 applies +1 kV to ion source 2 and a power source E2 applies an extraction voltage, −10 kV, to extractor electrode system 3, a voltage of −5 kV, which is applied by a power source E3 to liner 4 surrounding extractor electrode system 3, would decelerate the extracted ions by 5 kV, while the ions would travel with 6 kV of energy. Furthermore, if a power source E4 applies −1 kV to beam guide 7, the ions are transported with 2 kV energy through the section. Electrode apertures 10, 11 and 12, which are arranged in a three-stage design, converge the beam, decelerate it to the ground potential, and then the beam is implanted into wafer 14. The high energy transport of the beam prevents the beam from spreading, thus enabling the transport to be efficient. Moreover, extension tube 15 is connected to beam guide 7. The negative end of a voltage power supply E6 is connected to electrode aperture 11 and the positive end is connected to mass analyzer magnet 6 and disk chamber 13. In addition, electrode aperture 12 is connected so that it has the same electrical potential with that of disk chamber 13.

As for the formation of the beam, insulators 5, 8 and 9 ground the beam line, and hence, it does not need to be floated from the equipment itself as in the conventional designs.

Figure 2:
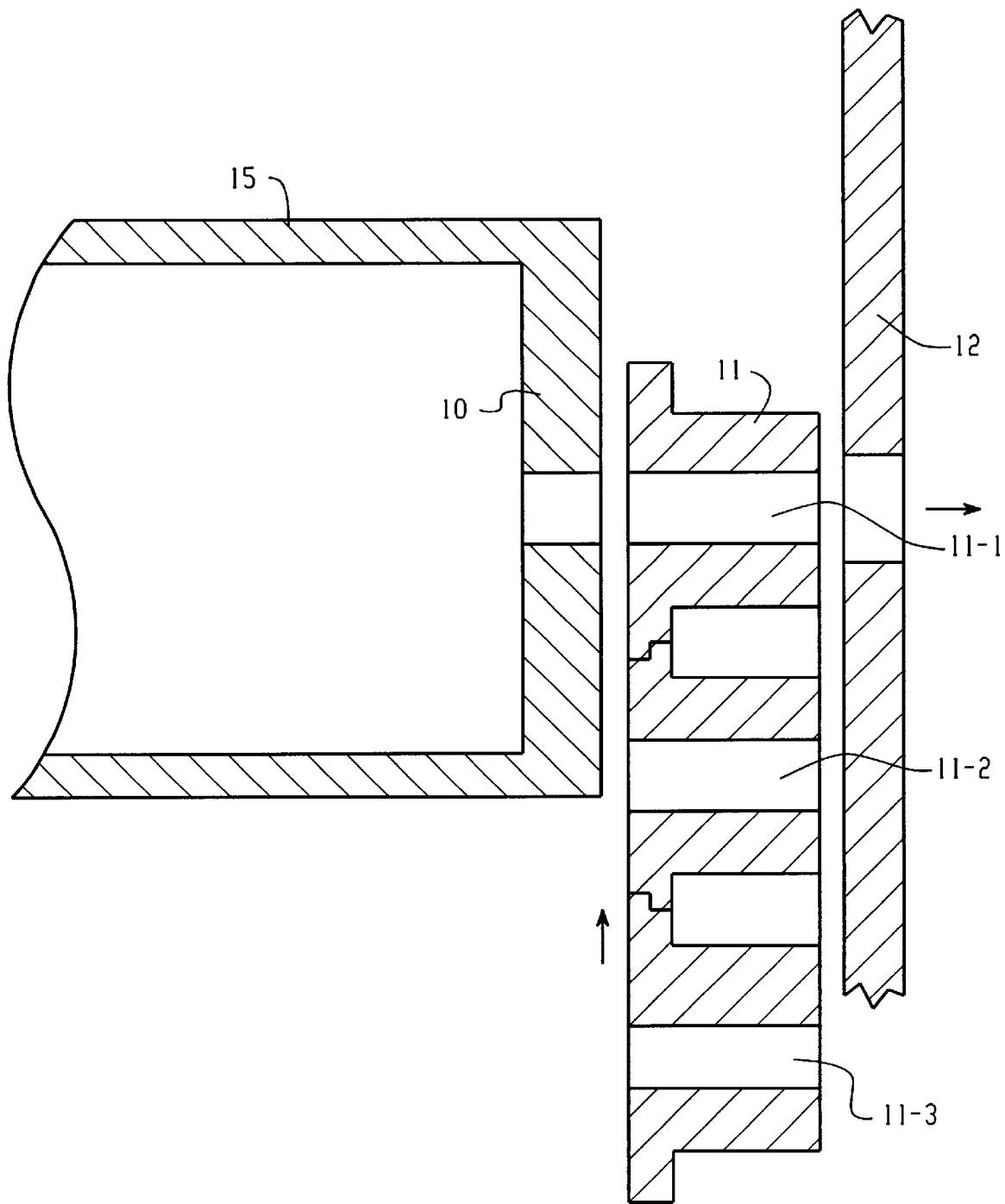
FIG. 2 is an enlarged diagram to show the electrode aperture section of FIG. 1.

In FIG. 2, electrode apertures 10, 11 and 12 are enlarged to show their structures which produce the ion beam deceleration and convergence effects. Particularly in this example, the aperture width of electrode aperture 11 can be switched depending on what ions pass through it. This is because the ion source may be interchanged for boron, arsenic or phosphor and there is an optimum aperture width to obtain excellent acceleration and deceleration effects in accordance with the source. Therefore, an aperture 11-1 dedicated to boron, an aperture 11-2 dedicated to arsenic and an aperture 11-3 dedicated to phosphor are provided on electrode aperture 11. The design allows the electrode aperture to slide. Electrode aperture 11 slides depending on which ion source is used. Thus, an aperture which should be placed between electrode apertures 10 and 12 is switched.

Improvements of the present invention can be facilitated in high current ion implantation equipment and can be used in the same manner as with conventional equipment, as long as the deceleration mechanism is not used. By switching on the deceleration function, the beam current in a lower energy region can be increased.

In the present invention, a high voltage case of prior art does not have to be used. Hence, the equipment of the present invention saves the required space and achieves a cost reduction compared to conventional equipment designs. Moreover, the equipment is maintained to operate in the same beam energy region as the conventional equipment, while a large current can be obtained in a lower energy region. The lower energy implantation is necessary to fabricate a shallow junction using, for example, boron ions. In addition, the present invention provides for space saving, and lower manufacturing costs and time as compared to conventional designs.

What is claimed is:

1. A deceleration and focusing lens for decelerating and focusing an ion beam in an ion implanter, comprising:
   (i) a first electrode (10) providing a first aperture through which an ion beam may pass, said first electrode residing in a first plane;
   (ii) a third electrode (12) providing a third aperture through which an ion beam may pass, said first and third apertures aligned with each other so that an ion beam passing through said first aperture may also pass through said third aperture, said third electrode residing in a third plane which is generally parallel to said first plane; and
   (iii) a second electrode (11) positioned between said first and third electrodes and residing in a second plane which is generally parallel to said first plane and said third plane, said second electrode providing at least a second primary aperture (11-1) and a second secondary aperture (11-2), said second electrode (11) slidable in a direction along said second plane to (a) a first position wherein said second primary aperture (11-1) aligns with said first and third apertures and (b) a second position wherein said second secondary aperture (11-2) aligns with said first and third apertures.

2. The deceleration and focusing lens of claim 1, wherein said second electrode (11) further provides a second tertiary aperture (11-3), said second electrode (11) slidable in a direction along said second plane to a third position wherein said second tertiary aperture (11-3) aligns with said first and third apertures.

3. The deceleration and focusing lens of claim 1, wherein said first electrode (10) is formed integrally with an extension tube (15) provided at an end of a beam guide (7).

4. The deceleration and focusing lens of claim 1, wherein said extension tube (15), said beam guide (7) and said first electrode (10) all reside at the same electrical potential.

5. The deceleration and focusing lens of claim 4, wherein said electrical potential is approximately negative one kilovolt (−1 kV).

6. The deceleration and focusing lens of claim 4, wherein said third electrode (13) resides at electrical ground potential.

7. The deceleration and focusing lens of claim 2, wherein said second primary aperture (11-1), said second secondary aperture (11-2) and said second tertiary aperture (11-3) are dedicated to boron, arsenic, and phosphor implantation applications for the ion implanter, respectively.

* * * * *